United States Patent [19]

Klein

[11] 3,731,160

[45] May 1, 1973

[54] MICROWAVE SEMICONDUCTOR DEVICE ASSEMBLY

[75] Inventor: Norman Sam Klein, Freehold, N.J.

[73] Assignee: RCA Corporation, New York, N.Y.

[22] Filed: May 8, 1972

[21] Appl. No.: 251,385

[52] U.S. Cl.........317/234 R, 317/234 G, 317/234 H, 329/162, 333/84 M

[51] Int. Cl...............................H01l 3/00, H01l 5/00

[58] Field of Search.......................317/234, 3, 4, 4.1; 329/160, 161, 162; 333/84 M; 174/52 S

[56] References Cited

UNITED STATES PATENTS

| | | | |
|---|---|---|---|
| 2,429,823 | 10/1947 | Kinman et al. | 329/162 |
| 3,343,107 | 9/1967 | Golightly | 329/162 X |
| 3,402,361 | 9/1968 | Havens | 317/234 B |
| 3,521,203 | 7/1970 | Sharpless | 329/161 X |
| 3,673,470 | 6/1972 | Louvel | 317/234 G |
| 3,553,610 | 1/1971 | Brenner et al. | 329/161 |

*Primary Examiner*—John W. Huckert
*Assistant Examiner*—Andrew J. James
*Attorney*—Glenn H. Bruestle et al.

[57] ABSTRACT

A semiconductor device assembly includes a semiconductor element mounted on a pedestal of a mounting plate. The mounting plate is secured between a pair of flanges, and co-axial terminals extend from the flanges. The co-axial terminals include outer ground plane walls and inner conductor pins electrically insulated from the outer walls. The conductor pins extend to the semiconductor element. The contacts of the semiconductor element are electrically connected to the mounting plate and conductor pins by short wires. A cover block is mounted on the flanges and extends over the semiconductor element. A retainer ring fits around the cover block and the flanges and firmly secures the cover block to the flanges.

8 Claims, 4 Drawing Figures

MICROWAVE SEMICONDUCTOR DEVICE ASSEMBLY

BACKGROUND OF THE INVENTION

The present invention relates to a microwave semiconductor device assembly, and more particularly to such an assembly which is easily connectable in a co-axial circuit.

With the increasing use of semiconductor devices in electrical circuits which operate at high frequencies, such as above about 2GHz, it has become necessary to design new package assemblies for proper operation of the semiconductor devices. Although the package assemblies for the semiconductor devices which have been used in the lower operating frequency circuits generally have acceptable mechanical and thermal capabilities, such package assemblies are not suitable for use at the higher frequencies because of parasitic inductances and capacitance. Thus, a semiconductor device assembly for the higher frequency operation must have the good mechanical and thermal properties of the lower frequency assemblies and in addition have minimum lead lengths and low interelectrode capacitance. In addition, it is desirable that the semiconductor device assembly provide for accurate characterization of the parameters of the semiconductor device so as to permit ease of use of the device in a circuit.

SUMMARY OF THE INVENTION

A semiconductor device assembly including a metal mounting plate and a pair of co-axial terminals secured to the mounting plate and extending in opposite directions from the mounting plate. The co-axial terminals include conductor pins having adjacent ends which are in closely spaced relation to the mounting plate. A semiconductor element having at least two conductors is mounted on the mounting plate substantially between the adjacent ends of the conductor pins. The conductors of the semiconductor element are electrically connected to separate ones of the conductor pins. A metal cover block extends over the mounting plate in closely spaced relation with the semiconductor element and is secured to the mounting plate.

DETAILED DESCRIPTION

Figure 2:
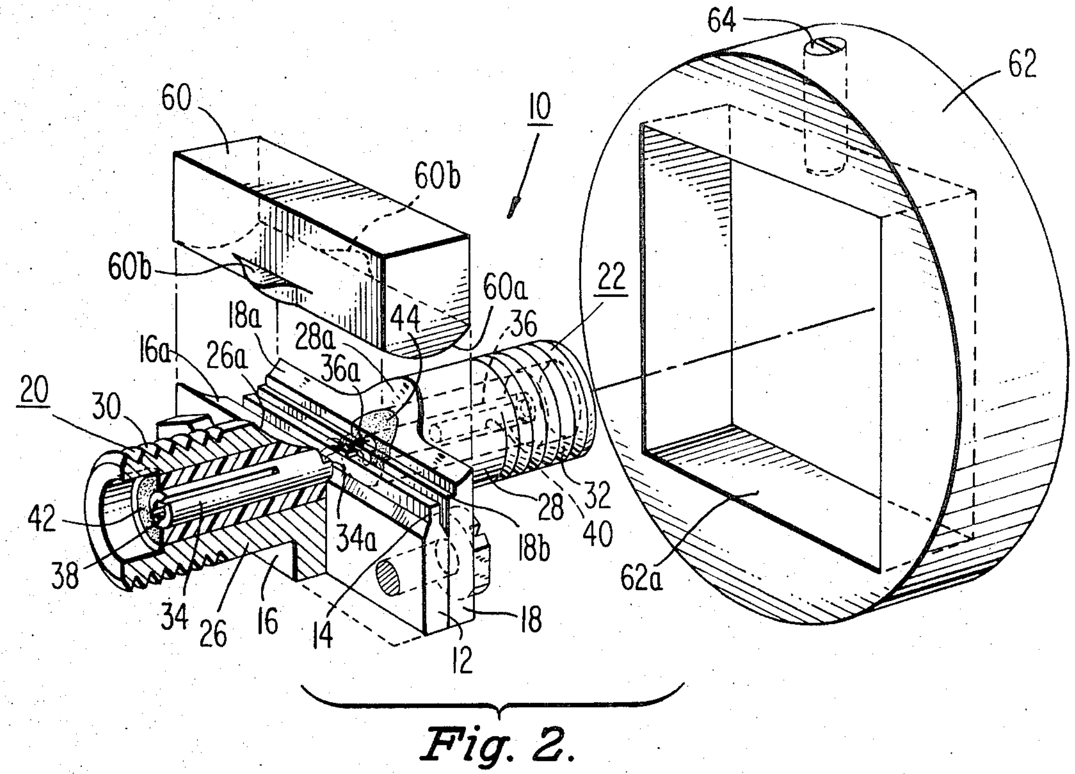
FIG. 2 is an enlarged exploded perspective view, partly broken-away, of the semiconductor device assembly.

Referring to the drawings, the semiconductor device assembly of the present invention is generally designated by the numeral 10. The semiconductor device assembly 10 comprises a substantially rectangular mounting plate 12 (FIG. 4) of an electrically conductive metal having a mounting pedestal 14 along its upper edge. The pedestal 14 is narrower than the mounting plate 12 and extends centrally along the edge of the mounting plate. The mounting plate 12 is secured between a pair of identical flanges 16 and 18 on the ends of co-axial terminals 20 and 22 (FIG. 2) respectively. The flanges 16 and 18 and the mounting plate 12 are firmly secured together by headed screws 24. The upper edges 16a and 18a of the flanges 16 and 18 are curved so as to extend along a common arc whose lowermost point is over but above the pedestal 14. Each of the flanges 16 and 18 has a ledge, 16b and 18b (FIG. 3), respectively, extending along its surface which faces the mounting plate 12. The ledges 16b and 18b extend along and are substantially co-planar with the top surface of the mounting pedestal 14.

Each of the co-axial terminals 20 and 22 comprises a cylindrical outer wall 26 and 28, respectively, of an electrically conductive metal which is integral with (FIG. 4) and extends perpendicularly from the outer surface of the flanges 16 and 18, respectively. An upper portion of each of the outer walls 26 and 28 projects beyond the upper edges 16a and 18a (FIG. 2) of the flanges 16 and 18. The end surface 26a and 28a of the outer walls 26 and 28 respectively, which project above the upper edges 16a and 18a of the flanges are curved to extend along the same arc as the flange upper edges 16a and 18a. The ends 30 and 32 of the terminals 20 and 22 are externally threaded.

Metal pins 34 and 36 extend longitudinally and co-axially through the outer walls 26 and 28, respectively. The pins 34 and 36 extend from just inside the free ends of the outer walls 26 and 28 through the flanges 16 and 18 to the inner surfaces thereof, and the inner ends of the pins 34 and 36 are notched to provide surfaces 34a and 36a, respectively, which are substantially flush with the flange ledges 16b and 18b, respectively. Each of the pins 34 and 36 has a passage 38 and 40 respectively extending longitudinally through a portion of the length of the pins from the free ends of the pins. The passages 38 and 40 are adapted to receive a connector pin, not shown.

Sleeves 42 and 44 of an electrical insulating material, such as a plastic, surround the pins 34 and 36 respectively and completely fill the space between the pins 34 and 36 and the outer walls 26 and 28, respectively. The sleeves 42 and 44 mechanically secure the pins 34 and 36 within the outer walls 26 and 28 and electrically insulate the pins 34 and 36 from both the outer walls 26 and 28 and the flanges 16 and 18. The inner ends of the sleeves 42 and 44 are curved to correspond with the curve of the other wall end surfaces 26a and 28a.

Figure 3:
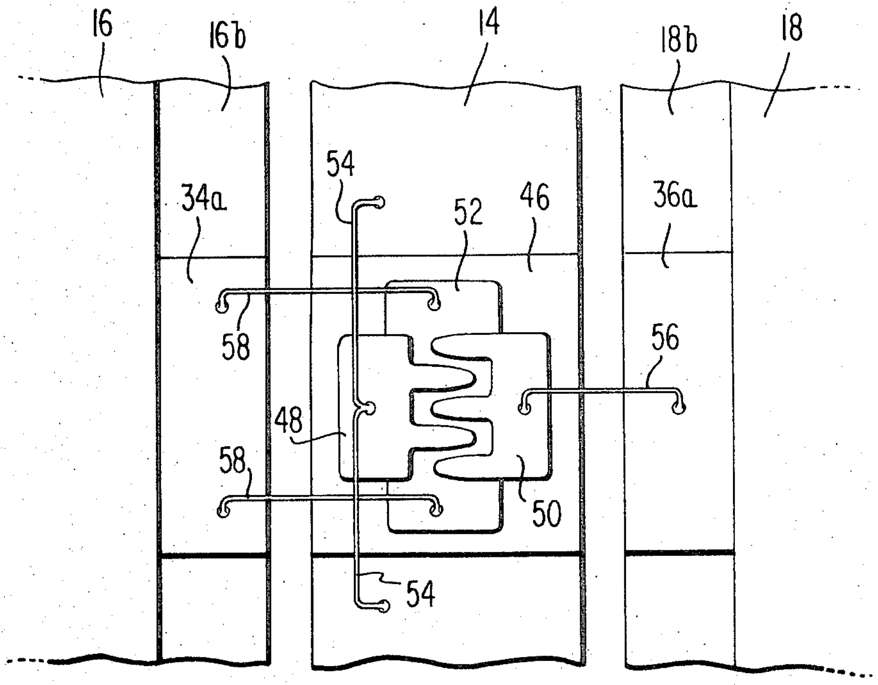
FIG. 3 is an enlarged top plan view of a portion of the semiconductor device assembly showing the manner of electrically connecting the semiconductor device to the input, output and ground plane of the assembly.

A semiconductor element 46 is mounted on the mounting pedestal 14 between the ends of the pins 34 and 36. As shown in FIG. 3, the semiconductor element 46 is a field-effect transistor of the type shown and described in an article of L. S. Napoli et al., entitled "-Switching Times of a Moderate-Power GaAs Field-Effect Transistor," RCA REVIEW, Vol. 32, No. 4, Dec. 1971, pgs. 645–649. As described in the article, the field-effect transistor 46 comprises a body of a semiconductive material having therein spaced source and drain regions with a gate therebetween. On the upper surface of the body are spaced source and drain contacts 48 and 50 having interdigitated fingers and a gate contact 52 extending between the source and drain contacts 48 and 50. The source contact 48 is electrically connected to the mounting pedestal 14 by a pair of fine wires 54–54 which extend between and are bonded to the source contact 48 and the upper surface of the mounting pedestal 14. The drain contact 50 is electrically connected to the pin 36 by a fine wire 56 which extends between and is bonded to the drain contact 50 and the surface 36*a* of the pin 36. The gate contact 52 is electrically connected to the pin 34 by a pair of fine wires 58–58 which extend between and are bonded to the gate contact 52 and the surface 34*a* of the pin 34. Since the pins 34 and 36 are close to the semiconductor device 46, the interconnecting wires 56 and 58 can be very short. Also, the interconnecting wires 54 are short. The semiconductor device 46 can be any type of semiconductor device which is capable of operating at high frequencies, such as a bipolar transistor, a diode or an integrated circuit. Also, the choice of which of the contacts of the semiconductor device 46 are electrically connected to the various pins 34 and 36 and mounting pedestal 14 depends on the manner in which the semiconductor device is to be connected into the microwave circuit.

Figure 1:
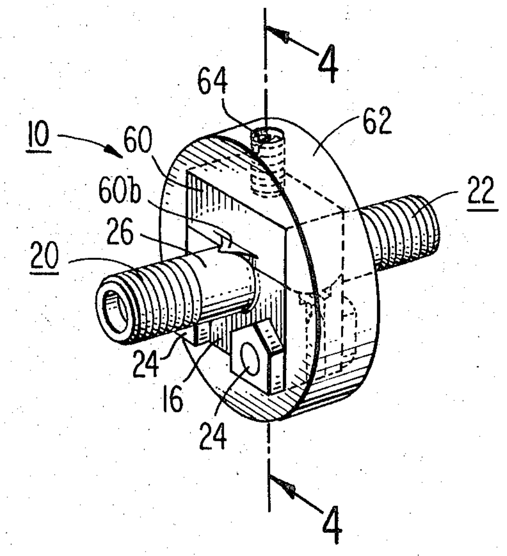
FIG. 1 is a perspective view of a semiconductor device assembly in accordance with the present invention.
Figure 4:
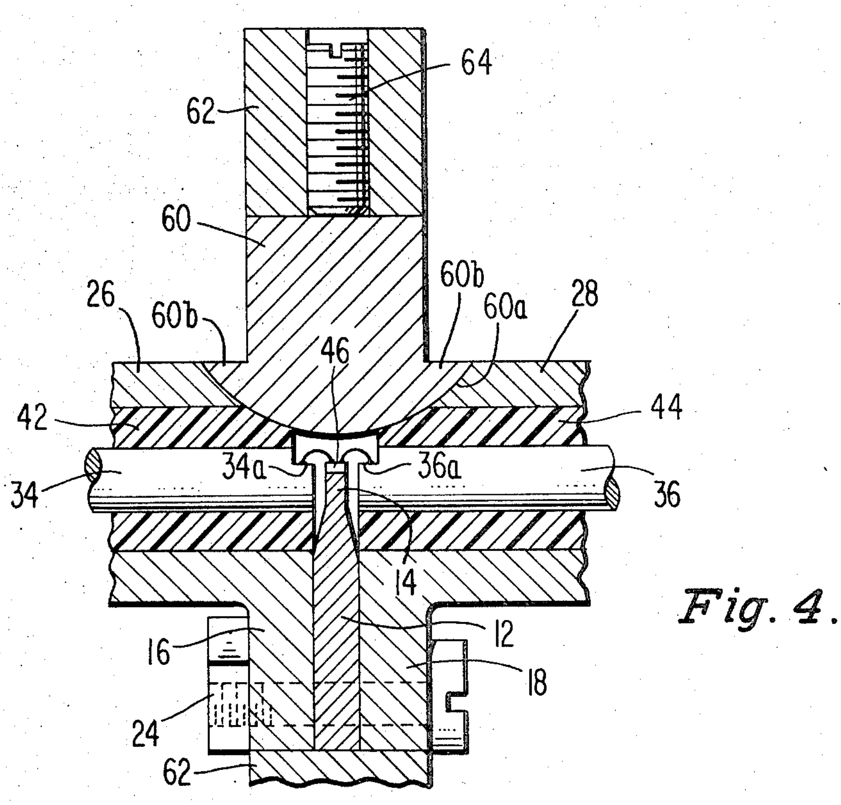
FIG. 4 is a sectional view taken along line 4—4 of FIG. 1.

A cover block 60 is seated on the flanges 16 and 18 and extends over the mounting pedestal 14. The cover block 60 is a substantially rectangular block of an electrically conductive metal having a curved bottom surface 60*a* which corresponds with the curvature of the top surfaces 16*a* and 18*a* of the flanges 16 and 18. Thus, as shown in FIG. 4, the bottom surface 60*a* of the cover block seats on the top surfaces 16*a* and 18*a* of the flanges 16 and 18 with the lowermost portion of the bottom surface 60*a* being in closely spaced covering relation with the semiconductor element 46 and the ends of the pins 34 and 36. A portion of the curved bottom surface 60*a* is wider than the width of the cover block 60 so as to provide a pair of lips 60*b*—60*b* projecting beyond the side surfaces of the cover block which mate with the curved end surfaces 26*a* and 28*a* of the outer walls 26 and 28, respectively. The cover block 60 is of a length equal to the lengths of the flanges 16 and 18 and of a width substantially equal to the combined widths of the flanges 16 and 18 and the mounting plate 12. Thus, when the cover block 60 is seated on the flanges 16 and 18, the assembly is substantially rectangular, as shown in FIG. 1. A metal retainer ring 62 fits around the assembly of the mounting block 60, flanges 16 and 18 and mounting plate 12. The retainer ring 62 has a rectangular opening 62*a* therethrough of a size and shape to snugly receive the assembly of the cover block 60, flanges 16 and 18 and the mounting plate 12. A set screw 64 is threaded through the retainer ring and engages the top surfaces of the mounting block 60 so as to firmly secure the retainer ring 62, mounting block 60 and flanges 16 and 18 together.

In the use of the semiconductor device assembly 10, the assembly can be connected in a microwave circuit by connecting a standard co-axial connector (not shown) to each of the co-axial terminals 20 and 22. The co-axial connectors include outer ground plane sleeves which are threaded around the outer walls 26 and 28 of the co-axial terminals 20 and 22 and center conductor pins which fit into the passage 38 and 40 in the ends of the pins 34 and 36 of the co-axial terminals. Thus, the outer walls 26 and 28 of the terminals 20 and 22, the flanges 16 and 18, the mounting plate 12 and the cover block 60, all of which are electrically connected together, are the ground plane of the assembly. One of the pins of the terminals, such as the pin 34 of the terminal 20, is the input conductor and the other pin, such as the pin 36 of the terminal 22, is the output conductor. Thus, in the assembly 10 shown, the source contact 48 of the semiconductor element 46 is electrically connected to the ground plane by the wires 54–54, the gate contact 52 is electrically connected to the input conductor pin 34 by the wires 58–58 and the drain contact 50 is electrically connected to the output conductor pin 36 by the wire 56. The flanges 16 and 18 and the mounting plate 12 also serve as a heat sink for the semiconductor element 46 so as to conduct heat generated in the semiconductor element away from the semiconductor element.

Thus, the semiconductor device assembly 10 provides a mechanically compact and strong package for the semiconductor element 46 and has good thermal properties for conducting heat away from the semiconductor element. Since the wires 54, 56 and 58 which connect the semiconductor element 46 to the ground plane and the input and output conductor pins are short because of the small spacing between the semiconductor element and the ground plane and conductor pins, the internal parasitic inductances of the assembly is low. Since the cover block 60 extends across the space between and close to the ends of the conductor pins 34 and 36 (FIG. 4), the parasitic capacitance between the input and output conductor pins is low. Thus, the semiconductor device assembly 10 has minimum internal parasitic inductance and capacitance so as to be highly suitable for high frequency operation. In addition, since the terminals 20 and 22 of the assembly 10 are co-axial, their electrical characteristics can match those of the co-axial lines of the electrical circuit in which the assembly 10 is to be used. Thus, the parameters of the semiconductor device can be accurately characterized from input to output of the assembly so that a circuit designer can easily design the assembly into a circuit.

I claim:

1. A semiconductor device assembly comprising
a metal mounting plate,
a pair of co-axial terminals secured to the mounting plate and extending in opposite directions therefrom, said co-axial terminals including conductor pins having adjacent ends which are in closely spaced relation to said mounting plate,
a semiconductor element mounted on said mounting plate substantially between the adjacent ends of the conductor pins, said semiconductor element including at least two conductors,
means electrically connecting the conductors of the semiconductor element to separate ones of the conductor pins,
a metal cover block extending over the mounting plate in closely spaced relation with said semiconductor element, and said adjacent end of the conductor pin, and
means securing said cover block to said mounting plate.

2. A semiconductor device assembly in accordance with claim 1 in which each of the co-axial terminals includes a cylindrical, metal outer wall, the conductors pins extend through the outer walls substantially along the axes of the outer walls, and an electrical insulating material fills the space between the pins and the outer walls to electrically insulate the pins from the outer walls.

3. A semiconductor device assembly in accordance with claim 2 including a metal flange extending from the adjacent ends of the outer walls of each of the co-axial terminals, said flanges extending along opposite sides of the mounting plate, and means securing said flanges and the mounting plate together.

4. A semiconductor device assembly in accordance with claim 3 in which the mounting plate has a mounting pedestal along its upper edge, the mounting pedestal being narrower than the mounting plate so as to be spaced from the flanges and the upper surface of the pedestal being below the upper edges of the flanges, and the semiconductor element is mounted on the upper edge of the pedestal.

5. A semiconductor device assembly in accordance with claim 4 in which the upper edges of the flanges are curved along a common arc, and the cover block has a curved surface which seats on the upper edges of the flanges and extends over the semiconductor element.

6. A semiconductor device assembly in accordance with claim 5 in which the curved surface of the cover block extends between at least a portion of the adjacent ends of the conductor pins.

7. A semiconductor device assembly in accordance with claim 6 in which the semiconductor element has three contacts, one of said contacts being electrically connected to the upper edge of the pedestal, and each of the other two contacts being electrically connected to an adjacent end of a separate one of the conductor pins.

8. A semiconductor device assembly in accordance with claim 7 in which the means securing the cover block to the mounting plate includes a metal retainer ring which fits around and is secured to the cover block, flanges and mounting plate.

* * * * *